US007180821B2

(12) United States Patent
Ruckerbauer et al.

(10) Patent No.: US 7,180,821 B2
(45) Date of Patent: Feb. 20, 2007

(54) MEMORY DEVICE, MEMORY CONTROLLER AND MEMORY SYSTEM HAVING BIDIRECTIONAL CLOCK LINES

(75) Inventors: Hermann Ruckerbauer, Moos (DE); Christian Sichert, München (DE); Dominique Savignac, Ismaning (DE); Peter Gregorius, München (DE); Paul Wallner, Prien (DE)

(73) Assignee: Infineon Technologies AG, Munich (DE)

( * ) Notice: Subject to any disclaimer, the term of this patent is extended or adjusted under 35 U.S.C. 154(b) by 201 days.

(21) Appl. No.: 10/954,869

(22) Filed: Sep. 30, 2004

(65) Prior Publication Data

US 2006/0067156 A1 Mar. 30, 2006

(51) Int. Cl.
*G11C 8/00* (2006.01)
(52) U.S. Cl. .................. 365/233; 365/233; 365/230.05
(58) Field of Classification Search ................. 365/233
See application file for complete search history.

(56) References Cited

U.S. PATENT DOCUMENTS 6,898,726 B1 * 5/2005 Lee ............................ 713/503
6,941,484 B2 * 9/2005 To et al. ...................... 713/500
2002/0129215 A1 * 9/2002 Yoo et al. .................... 711/167
2003/0026162 A1 * 2/2003 Matsui ......................... 365/233
2003/0206475 A1 * 11/2003 Duh et al. .................... 365/221

OTHER PUBLICATIONS

Matthew Haycock and Randy Mooney, "3.2GHz 6.4Gb/s per Wire Signaling in 0.18μm CMOS", 2001 IEEE International Solid-State Circuits Conference, pp. 62, 63 and 430.
Joseph Kennedy et al., "A 2Gb/s Point-to-Point Heterogeneous Voltage Capable DRAM Interface for Capacity-Scalable Memory Subsytems", 2004 IEEE International Solid-State Circuits Conference, Session 11.8.
Jin-Hyun Kim et al., "A 4 Gb/s/pin 4-Level Simutaneous Bidirectional IO using a 500MHz Clock for High-Speed Memory", 2004 IEEE International Solid-State Circuits Conference, Session 13.9.

* cited by examiner

*Primary Examiner*—Amir Zarabian
*Assistant Examiner*—Anthan Tran
(74) *Attorney, Agent, or Firm*—Patterson & Sheridan, L.L.P.

(57) ABSTRACT

One embodiment of the present invention provides to a memory device adapted to receive data according to a write clock signal and to output data according to a read clock signal, comprising a clock port configured to output the read clock signal and to receive the write clock signal and a serial bidirectional driver configured to output the read clock signal via the clock port and to receive the write clock signal via the clock port simultaneously.

13 Claims, 3 Drawing Sheets

MEMORY DEVICE, MEMORY CONTROLLER AND MEMORY SYSTEM HAVING BIDIRECTIONAL CLOCK LINES

BACKGROUND OF THE INVENTION

1. Field of the Invention

The present invention relates to a memory device, a memory controller which is capable to control operation of the memory device and a memory system.

2. Description of the Related Art

Conventional dynamic random access memory (DRAM) systems for writing data into a memory array and for reading out data from the memory array usually use different clock signals, i.e., a read clock signal and a write clock signal. The read clock signal is generated by the memory device such that it is synchronous to data to be output at output data ports. The write clock signal is generated within the memory controller and used to synchronize data to be written into the memory device so that the data to be written can be latched in the memory device.

In future high-speed memory interfaces, e.g., in view of a future DDR-4 (Double Data Rate) generation, the pin count for each channel of the memory device increases substantially, e.g., due to a differential signal transmission and the like. In such a memory system, the clock signals are provided on at least three lines, e.g., a command and address clock for transmitting command and address signals, a write clock signal which is synchronized to the data to be written to the memory device and a read clock signal which is synchronized to the data to be read out of the memory device. The high pin count results in an increased power consumption of the memory controller as well as the memory device and renders the design of the memory system more complex, especially for the routing of signal lines on a motherboard of the system.

It is therefore an aspect of the present invention to reduce the interconnection lines within a memory system and especially to reduce the pin count of a memory device used in a memory system.

SUMMARY OF THE INVENTION

According to a first aspect of the present invention, a memory device is provided which is adapted to receive data according to a write clock signal and to output data according to a read clock signal. The memory device includes a single clock port to output the read clock signal and to receive the write clock signal. A serial bidirectional driver is connected to the clock port and adapted to output the read clock signal via the clock port and to receive the write clock signal via the clock port simultaneously.

In such a memory device, the pin count can be reduced as both the read clock signal and the write clock signal associated with a number of data ports use the same clock port. Thereby the provision of a number of clock ports for the different clock signals becomes unnecessary. Especially when a plurality of memory devices is integrated in one memory module, the number of clock lines to the plurality of memory devices can be greatly reduced. Furthermore, a serial bidirectional driver provides the advantage that signals can be received and transmitted simultaneously.

In one embodiment of the present invention, the memory device is a Double-Data-Rate memory device.

The serial bidirectional driver may comprise a transmitter to output the read clock signal and a receiver to receive the write clock signal wherein the receiver substracts the output read clock signal from the received signal to obtain the write clock signal.

According to another aspect of the present invention, a memory controller is provided to control an operation of a memory device. The memory controller comprises a clock port to output a write clock signal and to receive a read clock signal, wherein the clock port is associated with a single memory device, and a serial bidirectional driver to output the write clock signal and receive the read signal via the clock port simultaneously.

By providing a serial bidirectional driver in a memory controller, the pin count of the memory controller can be reduced substantially since a memory controller normally operates a plurality of memory devices wherein each memory device has to be supplied with separate clock signals. By reducing the number of clock ports required to operate a memory device, the pin count of the memory controller can be reduced substantially.

In one embodiment, the memory controller is adapted to operate a Double-Data-Rate memory device.

The serial bidirectional driver of the memory controller may comprise a transmitter to output the write clock signal and a receiver to receive the read clock signal, wherein the receiver substracts the output write clock signal from the received signal to obtain the read clock signal.

According to another aspect of the present invention, a memory system is provided which includes at least one memory device adapted to read in data according to a write clock signal and to write out data according to a read clock signal, a memory controller to control operation of the memory device, a common clock line which extends from a clock port of the memory controller to a clock port of the memory device to carry the read clock signal and the write clock signal, a first serial bidirectional driver in the memory controller adapted to output this write clock signal to the common clock line and to receive the read clock signal via the common clock line from the memory device simultaneously and a second serial bidirectional driver in the memory device adapted to output the read clock signal to the common clock line and to receive the write clock signal via the common clock line from the memory controller simultaneously.

The memory system according to one embodiment of the present invention provides a single clock line between the memory controller and the memory device on which two independent clock signals are carried.

BRIEF DESCRIPTION OF THE DRAWINGS

These and other aspects and features of the present invention will become clear from the following description taken in conjunction with the accompanying drawings in which.

DETAILED DESCRIPTION OF THE PREFERRED EMBODIMENT

Figure 1:
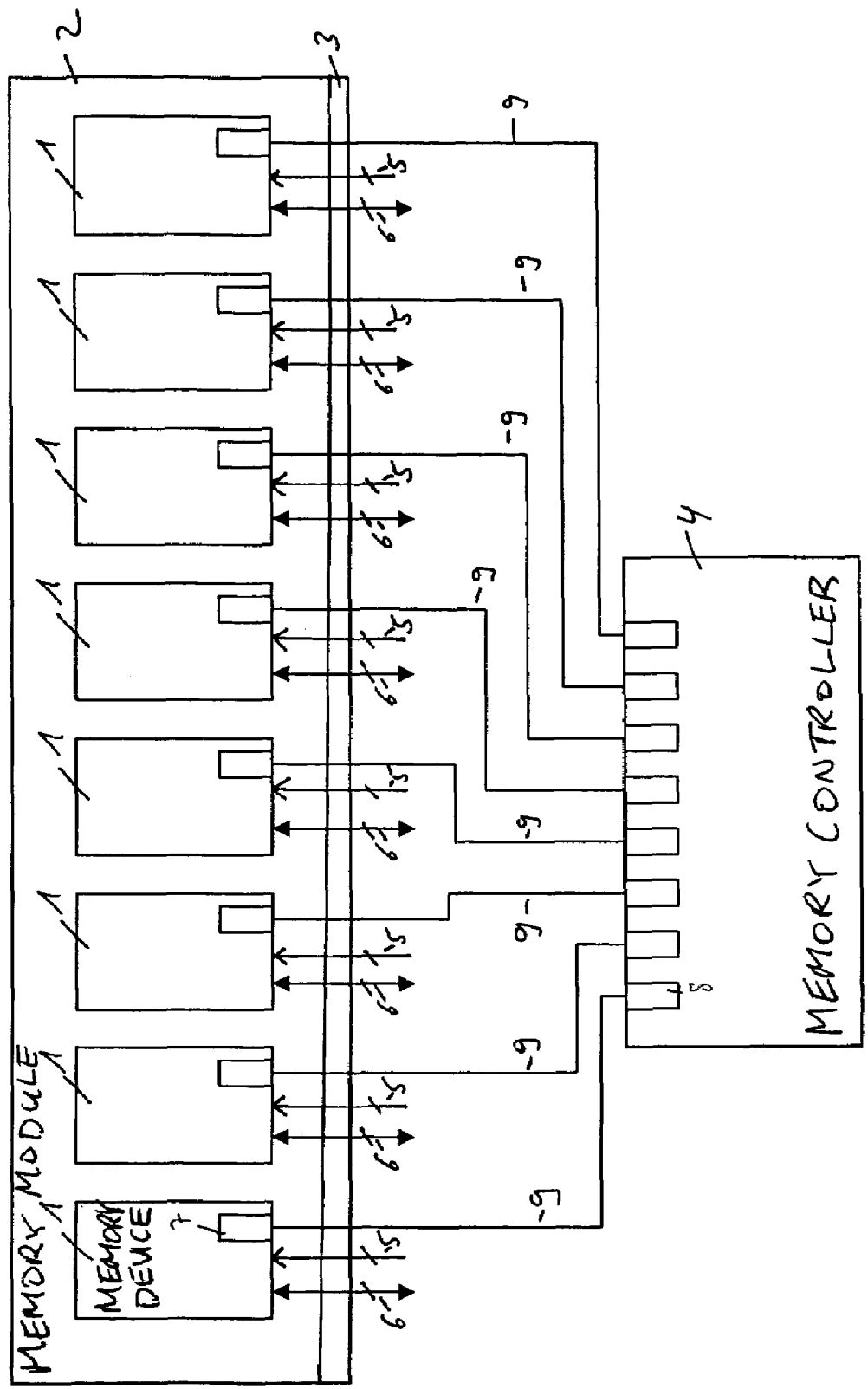
FIG. 1 is a block diagram of a memory system according to one embodiment of the present invention.

FIG. 1 shows a memory system, e.g., for a computer system, wherein memory devices 1 are arranged on a memory module 2 which comprises a module interface 3 to attach the memory module 2, e.g., to a motherboard of a computer system (not shown). The computer system further comprises a memory controller 4 to provide command and address signals to the memory module 2 via command and address lines 5. Data can be read out of and/or written into the memory devices 1 on the memory module 2 via a data bus 6. The memory controller 4 and the memory device 1 on the memory module 2 are interconnected with respective clock lines 9, wherein each of the memory devices 1 is connected via a separated single clock line 9 to the memory controller 4 on which a read clock signal and a write clock signal are carried. The read clock signal and the write clock signal are associated with a number of data lines of the data bus 6. Therefore, more than one read clock signal and more than one write clock signal can be provided to a single memory module 2 to read out and to write in data. In the following, an example of an integrated memory module is described including a number of data lines on which data can be read out or written into the memory devices 1 of the memory module 2.

The write clock signal is generated within the memory controller 4 and data to be written into the memory device 1 is synchronized to the write clock signal. The read clock signal is generated within the memory device 1 wherein the data to be read out of the memory device is synchronized to the read clock signal. The write clock signal and the read clock signal are simultaneously supplied to the clock line 9 via respective serial bidirectional drivers 7, 8 within the memory device 1 and the memory controller 4, respectively, as explained in detail below.

Figure 2:
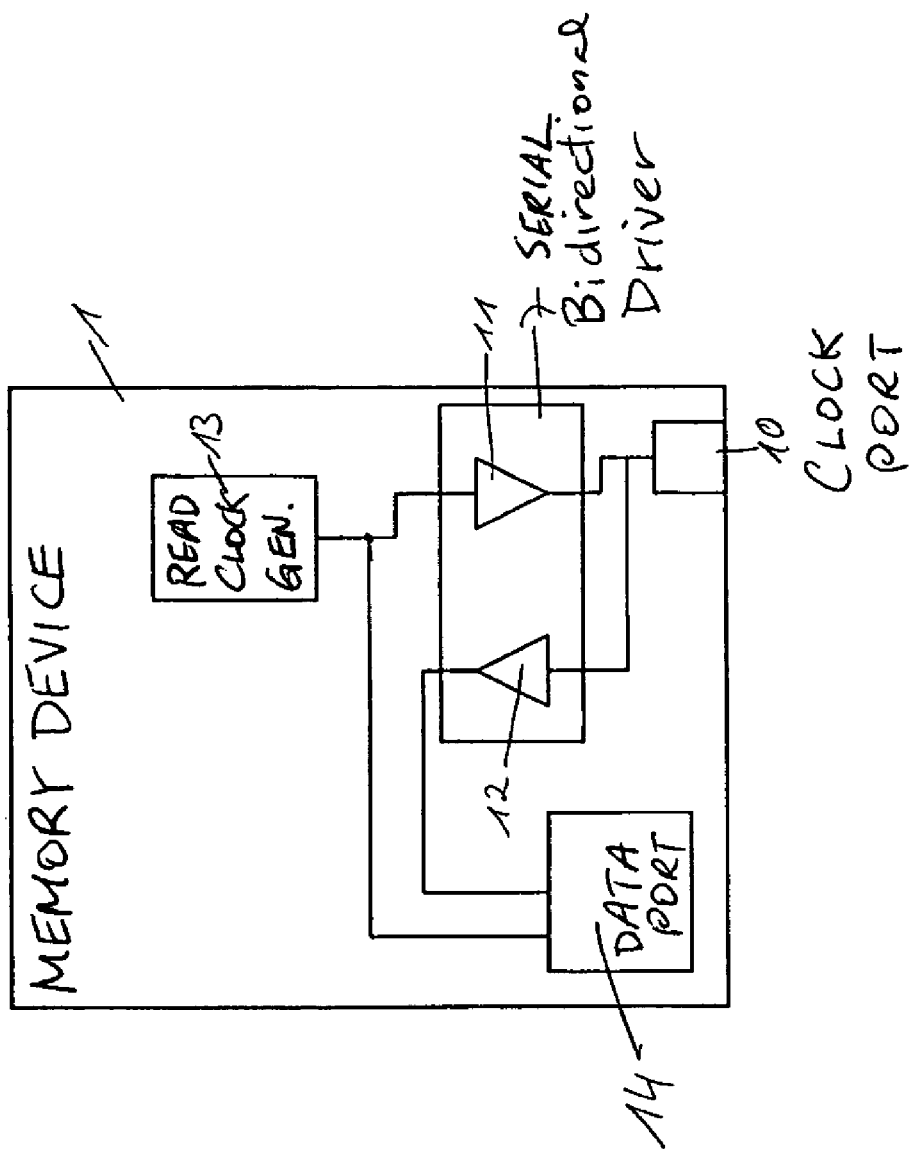
FIG. 2 is a memory device according to one embodiment of the present invention.

In FIG. 2, the memory device 1 is depicted. The memory device 1 comprises a clock port 10 which is connected via the respective clock line 9 to the memory controller 4. The clock port 10 is internally connected to a bidirectional driver 7 which includes a transmitter 11 and a receiver 12. The transmitter 11 is connected to a read clock generator 13 which generates and provides a read clock signal to the transmitter 11 so that the transmitter 11 can drive the read clock signal via the clock port 10 to the clock line 9. The receiver 12 is coupled to the clock port 10 as well. An output of the receiver 12 is coupled to a data input of a data port 14 for receiving data signals. A write clock signal provided to the clock port and received by the receiver 12 is supplied to the data port 14 to latch in the data received at the data port 14 at the same time. The data port 14 is also connected to the read clock generator 13 to drive output data synchronized to the read clock signal.

The bidirectional driver 7 is designed or configured to simultaneously output the read clock signal via the clock port 10 and to receive the write clock signal via the same clock port 10. The receiver 12 substracts the output read clock signal from the received signal at the clock port to obtain the write clock signal as a result (i.e., a resultant write clock signal which may be utilized to write data to a memory array of the memory device).

Figure 3:
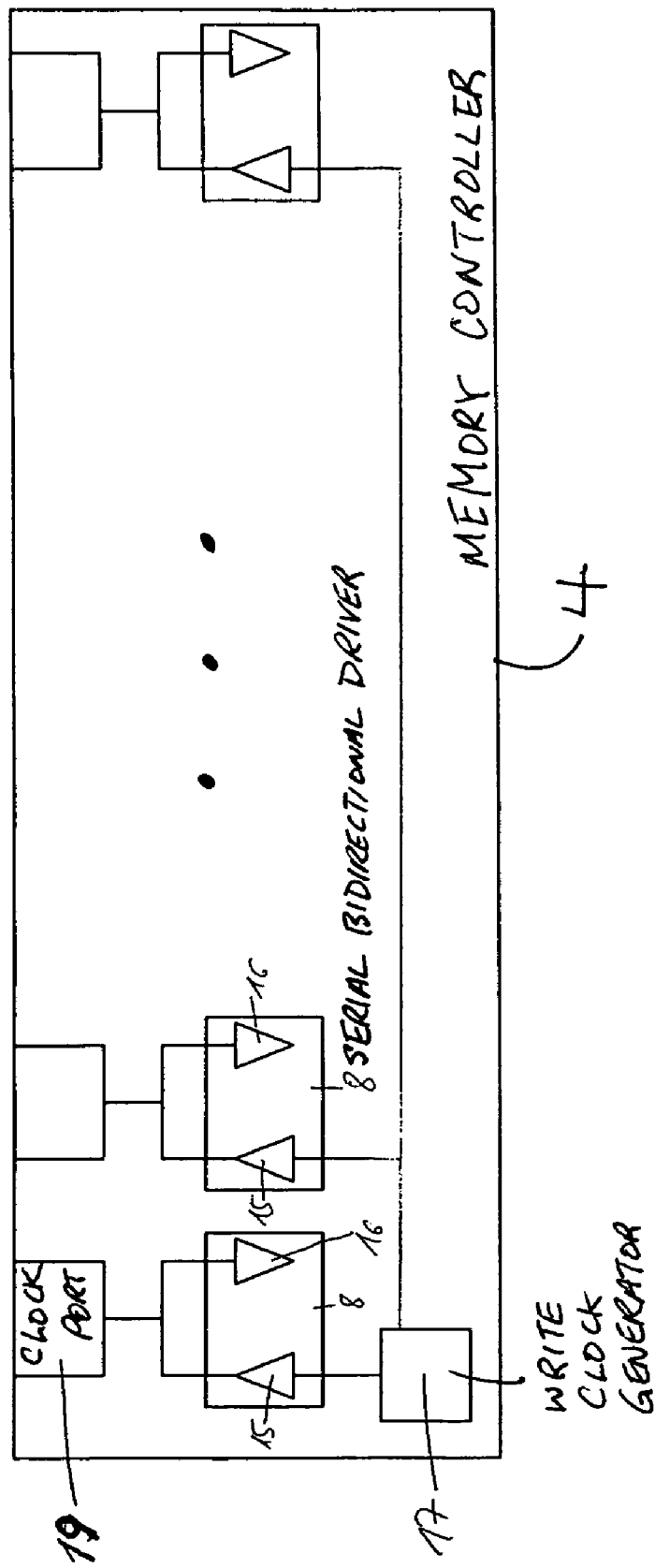
FIG. 3 is a memory controller according one embodiment of the present invention.

In FIG. 3, a block diagram of memory controller 4 according to one embodiment of the present invention is depicted. The memory controller 4 comprises a plurality of bidirectional drivers 8, each comprising a transmitter 15 and a receiver 16. Each transmitter 15 of each bidirectional driver 8 is connected to a single or multiple write clock generator 17 which provides a write clock signal and which is applied to the respective clock port 19 of the memory controller 4 to supply the write clock signal to each of the memory devices 1 of the connected memory module. The receiver 16 of each of the bidirectional drivers 8 is configured to receive a read clock signal on the clock line connected to the respective clock port by substracting the output write clock signal from the received signal to obtain the read clock signal (i.e., a resultant read clock signal which may be utilized to synchronize the reading of the data output from the memory device).

By transmitting the read clock signal and the write clock signal via a single clock line to each of the memory devices 1, at least one clock line can be saved, thereby decreasing the overall pin count of the memory controller 4 and the memory devices 1 on the memory module 2.

For memory devices and a respective memory controller designed for use in a Double-Data-Rate memory system, the pin count of the memory devices and the memory controller respectively is one essential factor for maintaining a high data transmission rate. Thus, embodiments of the present invention provide that the number of outputs of the memory devices and the memory controller, respectively, are reduced, thereby decreasing the power consumption of the respective components.

While the foregoing is directed to embodiments of the present invention, other and further embodiments of the invention may be devised without departing from the basic scope thereof, and the scope thereof is determined by the claims that follow.

What is claimed is:

1. A memory device configured to receive data according to a write clock signal and to output data according to a read clock signal, comprising:
   a clock port; and
   a serial bidirectional driver configured to output the read clock signal via the clock port and to receive the write clock signal via the clock port,
   wherein the serial bidirectional driver comprises a transmitter configured to output the read clock signal and a receiver configured to receive the write clock signal, and
   wherein the receiver subtracts the output read clock signal from the received write clock signal to obtain a resultant write clock signal to be utilized in writing data to a memory array of the memory device.

2. The memory device of claim 1, wherein the serial bidirectional driver is configured to output the read clock signal via the clock port and to receive the write clock signal via the clock port simultaneously.

3. The memory device of claim 1, further comprising:
   a data port having a data input coupled to an output of the receiver of the serial bidirectional driver.

4. The memory device of claim 3, further comprising:
   a read clock generator for generating the read clock signal, the read clock generator connected to provide the read clock signal to the transmitter of the serial bidirectional driver.

5. The memory device of claim 4, wherein the data port is connected to the read clock generator to drive output data synchronized to the read clock signal.

6. A memory controller for controlling an operation of a memory device, comprising:
   a clock port configured to output a write clock signal and to receive a read clock signal, wherein the clock port is associated with the memory device; and
   a serial bidirectional driver configured to output the write clock signal and to receive the read clock signal via the clock port,
   wherein the serial bidirectional driver is configured to output the write clock signal and to receive the read clock signal via the clock port simultaneously, wherein the serial bidirectional driver comprises a transmitter configured to output the write clock signal and a receiver configured to receive the read clock signal, and wherein the receiver subtracts the output write clock signal from the received read clock signal to obtain a resultant read clock signal for reading data output from the memory device.

7. The memory controller of claim 6, further comprising:
a write clock generator for generating the write clock signal, the write clock generator connected to provide the write clock signal to the transmitter of the serial bidirectional driver.

8. The memory controller of claim 6, wherein the memory controller is configured to operate a Double-Data-Rate (DDR) memory device.

9. The memory controller of claim 6, wherein the memory controller is configured to control operations of one or more memory devices and wherein the memory controller includes one or more respective clock ports and one or more respective serial bidirectional drivers corresponding to the one or more memory devices.

10. A memory system, comprising:
at least one memory device configured to read in data according to a write clock signal and to write out data according to a read clock signal;
a memory controller configured to control operation of the at least one memory device;
a common clock line disposed to connect a first clock port of the memory controller to a second clock port of the memory device and to carry the read clock signal and the write clock signal;
a first serial bidirectional driver, disposed in the memory controller, configured to output the write clock signal to the common clock line and to receive the read clock signal via the common clock line from the memory device; and
a second serial bidirectional driver, disposed in the at least one memory device, configured to output the read clock signal to the common clock line and to receive the write clock signal via the common clock line from the memory controller.

11. The memory system of claim 10, wherein the first serial bidirectional driver is configured to output the write clock signal to the common clock line and to receive the read clock signal via the common clock line from the memory device simultaneously, and wherein the second serial bidirectional driver is configured to output the read clock signal to the common clock line and to receive the write clock signal via the common clock line from the memory controller simultaneously.

12. The memory system of claim 10, wherein the memory device is a Double-Data-Rate (DDR) memory device.

13. The memory system of claim 10, wherein the at least one memory device comprises a plurality of memory devices, wherein the memory controller includes a respective first clock port and a respective first serial bidirectional driver corresponding respectively to each memory device, wherein each memory device includes a respective second clock port and a respective second serial bidirectional driver, and wherein a respective common clock line is disposed to connect the respective first clock port to the respective second clock port.

* * * * *